(12) United States Patent
Lee

(10) Patent No.: US 11,879,845 B2
(45) Date of Patent: Jan. 23, 2024

(54) FLUORESCENCE FILTER AND IMAGE SENSOR MODULE INCLUDING SAME

(71) Applicant: SOL INC., Seoul (KR)

(72) Inventor: Jong Muk Lee, Seoul (KR)

(73) Assignee: SOL INC., Seoul (KR)

( * ) Notice: Subject to any disclaimer, the term of this patent is extended or adjusted under 35 U.S.C. 154(b) by 210 days.

(21) Appl. No.: 17/556,370

(22) Filed: Dec. 20, 2021

(65) Prior Publication Data

US 2022/0170860 A1 Jun. 2, 2022

Related U.S. Application Data

(63) Continuation of application No. PCT/KR2021/017576, filed on Nov. 26, 2021.

(30) Foreign Application Priority Data

Nov. 30, 2020 (KR) .................. 10-2020-0163842
Nov. 22, 2021 (KR) .................. 10-2021-0161469

(51) Int. Cl.
*G01N 21/64* (2006.01)
*G01N 21/91* (2006.01)
*G01N 21/17* (2006.01)

(52) U.S. Cl.
CPC ..... *G01N 21/6486* (2013.01); *G01N 21/1717* (2013.01); *G01N 21/91* (2013.01);
(Continued)

(58) Field of Classification Search
CPC ........... G01N 21/6486; G01N 21/1717; G01N 21/91; G01N 2021/174; G01N 2021/6471;
(Continued)

(56) References Cited

U.S. PATENT DOCUMENTS 9,564,469 B2 2/2017 Kim et al.
10,962,477 B2 3/2021 Won et al.
(Continued)

FOREIGN PATENT DOCUMENTS

KR 10-2016-0023158 A 3/2016
KR 10-2018-0016125 A 2/2018
(Continued)

OTHER PUBLICATIONS

The extended European search report issued by the European Patent Office dated Sep. 26, 2023, which corresponds to European Patent Application No. 21820435.2-1020 and is related to U.S. Appl. No. 17/556,370.

*Primary Examiner* — David P Porta
*Assistant Examiner* — Gisselle M Gutierrez
(74) *Attorney, Agent, or Firm* — Studebaker & Brackett PC

(57) ABSTRACT

The present disclosure relates to a fluorescence filter for measuring fluorescence generated by a measurement object and an image sensor module including the same, and includes an absorption filter transmitting light within a specific wavelength band generated by the measurement object including a fluorescent dye and absorbs light in the remaining wavelength bands, and a reflection filter that is disposed adjacent to the absorption filter, transmits light within a specific wavelength band generated by the measurement object, and reflects light in the remaining wavelength bands, wherein the absorption filter has a plurality of wells having a predetermined depth in which the measurement object is accommodated, and wherein the plurality of wells are disposed at regular intervals on an incident surface of the absorption filter to which external light is incident.

20 Claims, 10 Drawing Sheets

(52) U.S. Cl.
CPC .................. *G01N 2021/174* (2013.01); *G01N 2021/6471* (2013.01)

(58) Field of Classification Search
CPC .......... G01N 21/6454; H01L 27/14621; H01L 27/14625; G02B 5/201; G02B 5/26; G02B 5/285; G02B 21/34; G02B 5/223
See application file for complete search history.

(56) References Cited

U.S. PATENT DOCUMENTS

| | | | |
|---|---|---|---|
| 2004/0001196 A1* | 1/2004 | Shibazaki | G01N 21/6428 356/129 |
| 2009/0111207 A1 | 4/2009 | Choumane et al. | |
| 2010/0247382 A1 | 9/2010 | Lee | |
| 2011/0168915 A1* | 7/2011 | Yajima | G02B 5/285 250/459.1 |
| 2016/0054173 A1 | 2/2016 | Kim et al. | |
| 2018/0155782 A1* | 6/2018 | Zhong | C12Q 1/6874 |
| 2018/0156731 A1* | 6/2018 | Won | B01L 3/50851 |
| 2020/0380282 A1* | 12/2020 | Schwartz | H10K 59/12 |

FOREIGN PATENT DOCUMENTS

| | | |
|---|---|---|
| KR | 10-2018-0064678 A | 6/2018 |
| KR | 10-2019-0082845 A | 7/2019 |
| KR | 10-2019-0140439 A | 12/2019 |

\* cited by examiner

FLUORESCENCE FILTER AND IMAGE SENSOR MODULE INCLUDING SAME

CROSS-REFERENCE TO RELATED APPLICATION

The present application is a continuation of International Patent Application No. PCT/KR2021/017576, filed on Nov. 26, 2021, which is based upon and claims the benefit of priority to Korean Patent Application Nos. 10-2020-0163842 filed on Nov. 30, 2020 and 10-2021-0161469 filed on Nov. 22, 2021. The disclosures of the above-listed applications are hereby incorporated by reference herein in their entirety.

BACKGROUND

1. Technical Field

The present disclosure relates to a fluorescence filter for measuring fluorescence generated by a measurement object and an image sensor module including the same.

2. Description of Related Art

In general, an image sensor is a semiconductor device converting an optical signal into an electrical signal to be displayed or stored in a display device, and is mainly used together with an optical filter.

In addition, the optical filter is configured to transmit only a wavelength within a specific range, and only light having a wavelength of a specific range passing through the optical filter may be detected by the image sensor.

A conventional optical filter may be formed by stacking a plurality of layers having different characteristics in multi-layer form.

The optical filter configured as described above may transmit only light having a wavelength within a specific range by generating reflection, refraction, constructive interference, and destructive interference at the interface between the plurality of layers when light is transmitted through the plurality of layers.

In other words, the optical filter may transmit only light having a wavelength within a specific range and block light having a wavelength in the remaining ranges for filtering by a plurality of layers.

However, the optical filter having such a structure has excellent filtering effect when light is incident perpendicularly to the incident surface of the optical filter, but has a drawback in that the filtering effect is reduced when light is incident at an angle to the incident surface of the optical filter.

In particular, when the measurement object is a biosample such as cells, proteins, DNA, RNA, mRNA, viruses, etc., an optical filter capable of precise filtering so as to transmit only light within a desired wavelength band is further required.

Accordingly, in the future, there is a demand for the development of an optical filter capable of clearly acquiring an optical signal of a biosample by performing precise filtering transmitting only light within a desired wavelength band.

SUMMARY

An aspect of the present disclosure is directed to providing a fluorescence filter capable of clearly acquiring an optical signal of a measurement object by performing a precise filtering transmitting only light within a desired wavelength band by disposing an absorption filter transmitting light within a specific wavelength band generated by the measurement object and absorbs light in the remaining wavelength bands, and a reflection filter transmitting light within a specific wavelength band generated by the measurement object, and reflects light in the remaining wavelength band together, and an image sensor module including the same.

Another aspect of the present disclosure is directed to providing a fluorescence filter capable of obtaining a precise and clear optical signal by minimizing noise by disposing a partition in the absorption filter to block light noise entering from a surrounding well, and an image sensor module including the same.

The aspects of the present disclosure are not limited to those mentioned above, and other aspects not mentioned herein will be clearly understood by those skilled in the art from the following description.

A fluorescence filter according to an embodiment of the present disclosure includes an absorption filter transmitting light within a specific wavelength band generated by a measurement object and absorbs light in the remaining wavelength bands, and a reflection filter that is disposed adjacent to the absorption filter, transmits light within a specific wavelength band generated by the measurement object, and reflects light in the remaining wavelength bands, wherein the absorption filter has a plurality of wells having a predetermined depth in which the measurement object is accommodated, and wherein the plurality of wells are disposed at regular intervals on an incident surface of the absorption filter to which external light is incident.

In an embodiment, the absorption filter is characterized in that a base medium and an absorption material absorbing light in a wavelength band other than a specific wavelength band generated by the measurement object are mixed.

In an embodiment, the absorption material is at least one of a pigment and a photoresist.

In an embodiment, the absorption filter further includes a main partition disposed between the wells adjacent to each other.

In an embodiment, the main partition may be a well unit partition surrounding each well, and the main partition may be a group unit partition surrounding each well group when a well group in which a plurality of wells form one group is formed. The main partition may be a mixed partition in which a well unit partition surrounding each well and a group unit partition surrounding a well group in which a plurality of wells form one group are mixed.

In an embodiment, the main partition may be a single partition made of a material that blocks all of light within a first wavelength band generated by a first measurement object accommodated in a first well and a light in a second wavelength band generated by a second measurement object accommodated in the second well adjacent to the first well. The main partition may be a double partition including a first partition made of a material that blocks only light within a first wavelength band generated by a first measurement object accommodated in a first well, and a second partition made of a material that blocks only light in a second wavelength band generated by a second measurement object accommodated in a second well adjacent to the first well. The main partition may be a multiple partition including a first partition made of a material that blocks only light within a first wavelength band generated by a first measurement object accommodated in a first well, a second partition made of a material that blocks only light in a second wavelength band generated by a second measurement object accommodated in a second well adjacent to the first well, and a third partition made of a material that blocks only light within a third wavelength band generated by a third measurement object accommodated in a third well adjacent to the first and second wells.

In an embodiment, the present disclosure further includes a partition layer disposed adjacent to the reflection filter, wherein the partition layer includes a plurality of sub-partitions disposed to correspond to the main partition of the absorption filter.

In an embodiment, the plurality of sub-partitions is disposed to be aligned with the main partition of the absorption filter.

In an embodiment, the reflection filter includes a glass substrate and a multilayer film in which a plurality of layers is formed on the glass substrate to transmit light within a specific wavelength band generated by the measurement object, and reflect light in the remaining wavelength bands.

In an embodiment, the multilayer film may be disposed in an upper portion of the glass substrate or a lower portion of the glass substrate, and the multilayer film may be a high pass filter transmitting light in a high wavelength band and blocks light in a low wavelength band or a low pass filter transmitting light in a low wavelength band and blocks light in a high wavelength band.

In an embodiment, the multilayer film may include an upper multilayer film disposed in an upper portion of the glass substrate and a lower multilayer film disposed in a lower portion of the glass substrate.

In an embodiment, the absorption filter may be disposed in contact with an upper surface of the reflection filter when external light is incident in a direction of the absorption filter, and the absorption filter may be disposed in contact with a lower surface of the reflection filter when external light is incident in a direction of the reflection filter.

In an embodiment, the absorption filter may include a first absorption filter disposed in contact with an upper surface of the reflection filter, and a second absorption filter disposed in contact with a lower surface of the reflection filter.

An image sensor module including a fluorescence filter according to an embodiment of the present disclosure includes a fluorescence filter transmitting only light within a specific wavelength band generated by a measurement object, and an image sensor that senses light within a specific wavelength band transmitting the fluorescence filter. The fluorescence filter includes an absorption filter transmitting light within a specific wavelength band generated by the measurement object and absorbs light in the remaining wavelength bands, and a reflection filter that is disposed adjacent to the absorption filter, transmits light within a specific wavelength band generated by the measurement object, and reflects light in the remaining wavelength bands, wherein the absorption filter has a plurality of wells having a predetermined depth in which the measurement object is accommodated, and wherein the plurality of wells are disposed at regular intervals on an incident surface of the absorption filter to which external light is incident.

An image sensor module array including a fluorescence filter according to an embodiment of the present disclosure includes a fluorescence filter transmitting only light within a specific wavelength band generated by a measurement object, and a plurality of image sensor modules including an image sensor that senses light within a specific wavelength band transmitting the fluorescence filter. The plurality of image sensor modules is disposed in a matrix form to sense light within a specific wavelength band generated by different measurement objects to obtain a plurality of optical signals for the plurality of measurement objects. The fluorescence filter includes an absorption filter transmitting light within a specific wavelength band generated by the measurement object and absorbs light in the remaining wavelength bands, and a reflection filter that is disposed adjacent to the absorption filter, transmits light within a specific wavelength band generated by the measurement object, and reflects light in the remaining wavelength bands, wherein the absorption filter has a plurality of wells having a predetermined depth in which the measurement object is accommodated, and wherein the plurality of wells are disposed at regular intervals on an incident surface of the absorption filter to which external light is incident.

According to the present disclosure as above, by disposing an absorption filter transmitting light within a specific wavelength band generated by a measurement object and absorbs light in the remaining wavelength bands and a reflection filter transmitting light within a specific wavelength band generated by the measurement object, and reflects light in the remaining wavelength band together, it is possible to clearly obtain an optical signal of a biosample by performing precise filtering transmitting only light within a desired wavelength band.

In addition, according to the present disclosure, by disposing a partition in an absorption filter to block light noise entering from the surrounding wells, it is possible to obtain a precise and clear optical signal by minimizing noise.

The advantages of the present disclosure are not limited to those mentioned above, and other advantages not mentioned herein will be clearly understood by those skilled in the art from the following description.

DETAILED DESCRIPTION

The advantages and features of the present disclosure and methods of achieving them will be apparent from the embodiments that will be described in detail with reference to the accompanying drawings. It should be noted, however, that the present disclosure is not limited to the following embodiments, and may be implemented in various different forms. Rather the embodiments are provided so that this disclosure will be thorough and complete and will fully convey the scope of the present disclosure to those skilled in the technical field to which the present disclosure pertains. It is to be noted that the scope of the present disclosure is defined only by the claims.

Terms used in the specification are used to describe embodiments of the present disclosure and are not intended to limit the scope of the present disclosure. In the specification, the terms in singular form may include plural forms unless otherwise specified. The expressions "comprise" and/or "comprising" used herein indicate the existence of one or more other elements other than stated elements but do not exclude presence of additional elements. Like reference denotations refer to like elements throughout the specification. As used herein, the term "and/or" includes each and all combinations of one or more of the mentioned components. It will be understood that, although the terms "first", "second", etc., may be used herein to describe various components, these components should not be limited by these terms. These terms are only used to distinguish one component from another component. Accordingly, a first component mentioned below could be termed a second component without departing from the technical ideas of the present disclosure.

Unless otherwise defined, all terms (including technical and scientific terms) used herein have the same meaning as commonly understood by those skilled in the technical field to which the present disclosure pertains. It will be further understood that terms, such as those defined in commonly used dictionaries, should not be interpreted in an idealized or overly formal sense unless expressly so defined herein.

Hereinafter, the embodiments of the present disclosure will be described in detail with reference to the accompanying drawings.

Figure 1:
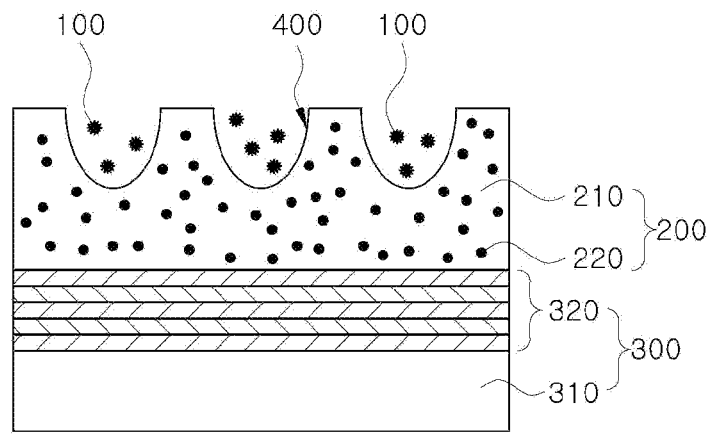
FIGS. 1 to 3 are structural cross-sectional views illustrating a fluorescence filter according to an embodiment of the present disclosure.
Figure 2:
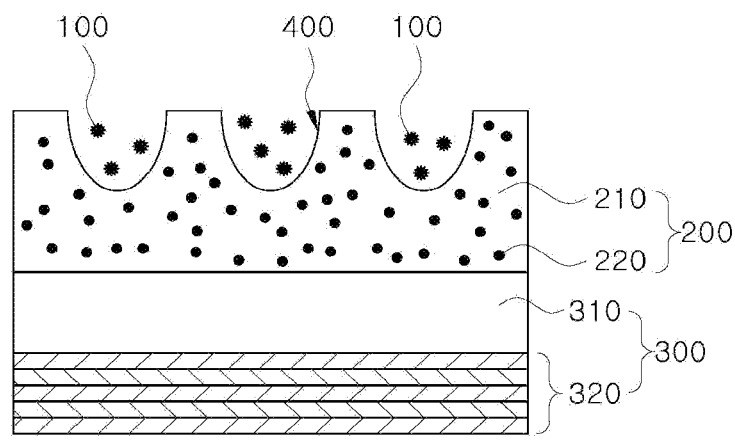
Figure 3:
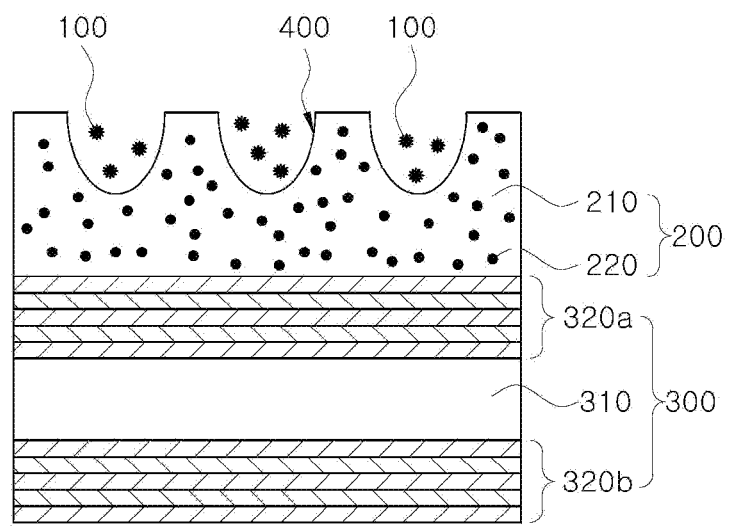

FIGS. 1 to 3 are structural cross-sectional views illustrating a fluorescence filter according to an embodiment of the present disclosure.

As illustrated in FIGS. 1 to 3, the fluorescence filter of the present disclosure may include an absorption filter 200 and a reflection filter 300 disposed in a lower portion of the absorption filter 200.

The absorption filter 200 may transmit light within a specific wavelength band generated by a measurement object 100 and absorb light in the remaining wavelength bands.

In addition, in the absorption filter 200, a base medium 210 and an absorption material 220 absorbing light in the remaining wavelength bands except a specific wavelength band generated by the measurement object 100 may be mixed.

As an example, the absorption material 220 may be at least one of a pigment and a photoresist, but this is only an example and is not limited thereto.

The absorption filter 200 may include about 60 to about 70% of a pigment, a dispersant, a binder for dispersing, a dispersion aid, and the like.

The configuration of the absorption filter 200 is not limited to the illustrated configuration, and may be configured in various ways essentially including a pigment or a photoresist.

In addition, in the absorption filter 200, a well 400 having a predetermined depth in which the measurement object 100 is accommodated may be formed.

A plurality of wells 400 may be disposed at regular intervals on an incident surface of the absorption filter 200 to which external light is incident.

In certain cases, the plurality of wells 400 may be disposed at irregular intervals.

In addition, the plurality of wells 400 may have the same diameter.

In certain cases, the plurality of wells 400 may have various diameters.

In addition, the plurality of wells 400 may have the same planar shape.

In certain cases, the plurality of wells 400 may have various planar shapes.

For example, the plurality of wells 400 may have various planar shapes, such as a circle, an ellipse, and a polygon.

Subsequently, the measurement object 100 accommodated in the well 400 may include biosamples such as cells, proteins, viruses, DNA, RNA, and mRNA, and this is only an example, but is not limited thereto.

A fluorescent dye is provided together with the measurement object 100 in the well 400.

The fluorescent dye is a substance in a state of being dissolved in a solvent, and the measurement object 100 may be dyed by the dissolved fluorescent dye.

In certain cases, when the measurement object 100 is combined with the fluorescent dye, the measurement object 100 may be combined with the fluorescent dye through a probe connector connecting the measurement object 100 and the fluorescent dye.

Accordingly, the measurement object 100 may emit fluorescence in response to light incident from the outside.

As an example, light emitted from the measurement object 100 may have a longer wavelength band than light incident from the outside, and this is only an example, but is not limited thereto.

Next, the reflection filter 300 may be disposed adjacent to the absorption filter 200, transmit light within a specific wavelength band generated by the measurement object 100, and reflect light in the remaining wavelength bands.

The reflection filter 300 may include a glass substrate 310 and a multilayer film 320 in which a plurality of layers is formed on the glass substrate 310 to transmit light within a specific wavelength band generated by the measurement object 100 and reflect light in the remaining wavelength bands.

In an embodiment, as illustrated in FIG. 1, the multilayer film 320 of the reflection filter 300 may be disposed in an upper portion of the glass substrate 310 and contact the absorption filter 200.

In another embodiment, as illustrated in FIG. 2, the multilayer film 320 of the reflection filter 300 may be disposed in a lower portion of the glass substrate 310 to be spaced apart from the absorption filter 200.

The multilayer film 320 may be a high pass filter transmitting light in a high wavelength band and blocks light in a low wavelength band, or a low pass filter transmitting light in a low wavelength band and blocks light in a high wavelength band.

As another embodiment, as illustrated in FIG. 3, the multilayer film 320 of the reflection filter 300 may include an upper multilayer film 320a disposed in an upper portion of the glass substrate 310 and a lower multilayer film 320b disposed in a lower portion of the glass substrate 310.

The upper multilayer film 320a may be a high pass filter transmitting light in a high wavelength band and blocks light in a low wavelength band, and a low pass filter transmitting light in a low wavelength band and blocks light in a high wavelength band.

In certain cases, the upper multilayer film 320a may be a low pass filter transmitting light in a low wavelength band and blocks light in a high wavelength band, and the lower multilayer film 320b may be a high pass filter that penetrates light in a high wavelength band and blocks light in a low wavelength band.

In addition, the reflection filter 300 may be formed of a material having a higher hardness of the glass substrate 310 and a higher hardness of the multilayer film 320.

Here, the glass substrate 310 may prevent the multilayer film 320 from being damaged by an external force.

As another embodiment, instead of the glass substrate 310, a substrate made of any medium that may be used for substantially the same purpose as glass may be used to form the reflection filter 300.

Figure 4:
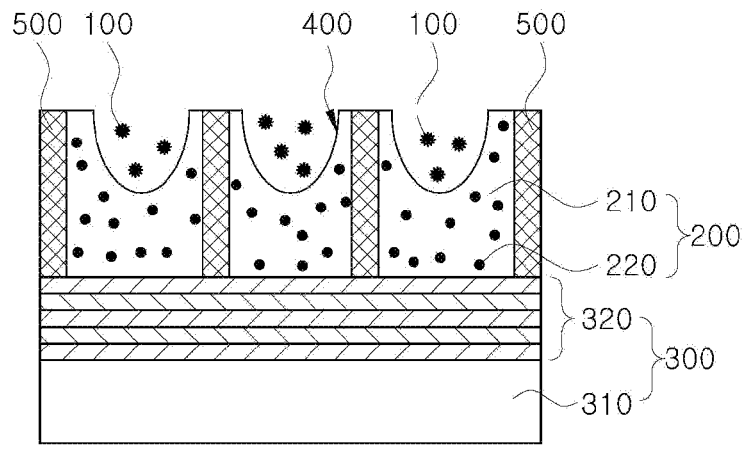
FIGS. 4 to 6 are structural cross-sectional views illustrating a fluorescence filter according to another embodiment of the present disclosure.
Figure 5:
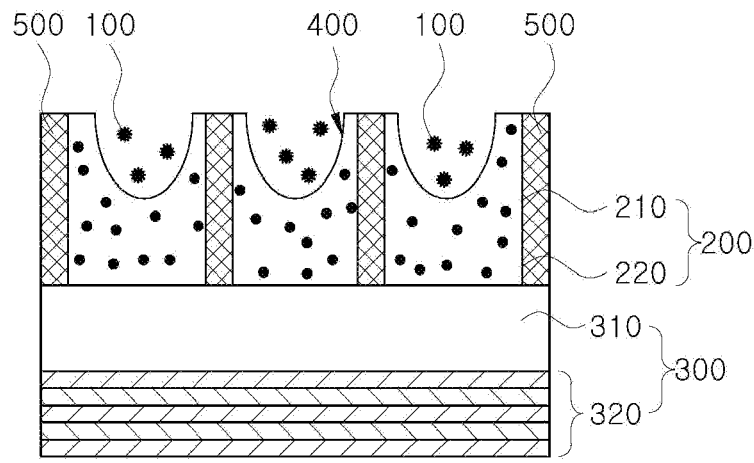
Figure 6:
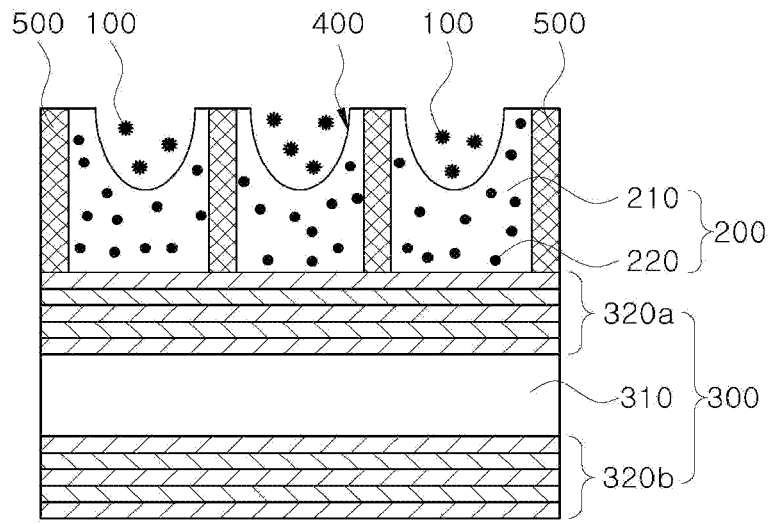

FIGS. 4 to 6 are structural cross-sectional views illustrating a fluorescence filter according to another embodiment of the present disclosure.

As illustrated in FIGS. 4 to 6, the fluorescence filter according to the present disclosure may include an absorption filter 200 and a reflection filter 300 disposed in a lower portion of the absorption filter 200.

The absorption filter 200 may further include a main partition 500 disposed between the wells 400 adjacent to each other.

As an example, the main partition 500 may be a well unit partition surrounding each well 400.

In certain cases, the main partition 500 may be a group unit partition surrounding each well group when a well group in which a plurality of wells 400 form one group is formed.

In another case, the main partition 500 may be a mixed partition in which a well unit partition surrounding each well 400 and a group unit partition surrounding a well group in which a plurality of wells 400 form one group is mixed.

In the plurality of wells 400 forming a well group, the measurement object 100 generating light within a specific wavelength band that does not provide noise in a direction of adjacent wells 400 may be accommodated within the well group. In other words, a plurality of wells 400 that do not generate light noise may form one well group.

In addition, in the plurality of wells 400 forming the well group, partitions may not exist between adjacent wells 400 within the well group.

In addition, the main partition 500 may be made of a material that blocks light within a specific wavelength band generated by the measurement object 100 accommodated within the well 400 from being transmitted in a direction of the adjacent wells 400.

The reason is to prevent light noise from being provided in a direction of the adjacent wells 400 to obtain a clear optical signal without noise.

As an example, the main partition 500 may be formed by mixing a base medium for blocking light within a specific wavelength band, such as the absorption filter 200, and an absorption material. The absorption material may be at least one of a pigment and a photoresist.

As an example, the main partition 500 may be a single partition made of a material that blocks all of light within a first wavelength band generated by a first measurement object accommodated in the first well and a light in a second wavelength band generated by a second measurement object accommodated in a second well adjacent to the first well.

As another example, the main partition 500 may be a double partition including a first partition made of a material that blocks only light within a first wavelength band generated by a first measurement object accommodated in the first well, and a second partition made of a material that blocks only light in a second wavelength band generated by a second measurement object accommodated in a second well adjacent to the first well.

The main partition 500 may be formed as a double partition when at least one of a first condition in which a first measurement object and a second measurement object are different from each other; a second condition in which the first measurement object and the second measurement object are identical to each other and a first fluorescent dye included in the first measurement object and a second fluorescent dye included in the second measurement object are different from each other; a third condition in which the first measurement object and the second measurement object are identical to each other and a first probe connector connecting the first measurement object and the first fluorescent dye and a second probe connector connecting the second measurement object and the second fluorescent dye are different from each other; and a fourth condition in which a first patient who provides the first measurement object and a second patient who provides the second measurement object are different from each other, is satisfied.

As another example, the main partition 500 may be a multiple partition including a first partition made of a material that blocks only light within a first wavelength band generated by a first measurement object accommodated in the first well, a second partition made of a material that blocks only light in a second wavelength band generated by a second measurement object accommodated in a second well adjacent to the first well, and a third partition made of a material that blocks only light within a third wavelength band generated by a third measurement object accommodated in a third well adjacent to the first and second wells.

The main partition 500 may be formed as a multiple partition when at least one of a first condition in which first, second, and third measurement objects are different from one another; a second condition in which the first, second, and third measurement objects are identical to one another, and a first fluorescent dye included in the first measurement object, a second fluorescent dye included in the second measurement object, and a third fluorescent dye included in the third measurement object are different from one another; a third condition in which the first, second, and third measurement objects are identical to one another, and a first probe connector connecting the first measurement object and the first fluorescent dye, a second probe connector connecting the second measurement object and the second fluorescent dye, and a third probe connector connecting the third measurement object and the third fluorescent dye are different from one another; and a fourth condition in which a first patient who provides the first measurement object, a second patient who provides the second measurement object, and a third patient who provides the third measurement object are different from one another, is satisfied.

Through the main partition, measurement accuracy may be improved during multiple diagnosis.

In addition, in the absorption filter 200, the base medium 210 and the absorption material 220 absorbing light in the remaining wavelength bands except a specific wavelength band generated by the measurement object 100 may be mixed.

As an example, the absorption material 220 may be at least one of a pigment and a photoresist, and this is only an example and is not limited thereto.

In addition, in the absorption filter 200, a well 400 having a predetermined depth in which the measurement object 100 is accommodated may be formed.

In addition, the reflection filter 300 may include a glass substrate 310 and a multilayer film 320 in which a plurality of layers is formed on the glass substrate 310 to transmit light within a specific wavelength band generated by the measurement object 100 and reflect light in the remaining wavelength bands.

In an embodiment, as illustrated in FIG. 4, the multilayer film 320 of the reflection filter 300 may be disposed in an upper portion of the glass substrate 310 and contact the absorption filter 200.

In another embodiment, as illustrated in FIG. 5, the multilayer film 320 of the reflection filter 300 may be disposed in a lower portion of the glass substrate 310 to be spaced apart from the absorption filter 200.

As another embodiment, as illustrated in FIG. 6, the multilayer film 320 of the reflection filter 300 may include an upper multilayer film 320a disposed in an upper portion of the glass substrate 310 and a lower multilayer film 320b disposed in a lower portion of the glass substrate 310.

Figure 7:
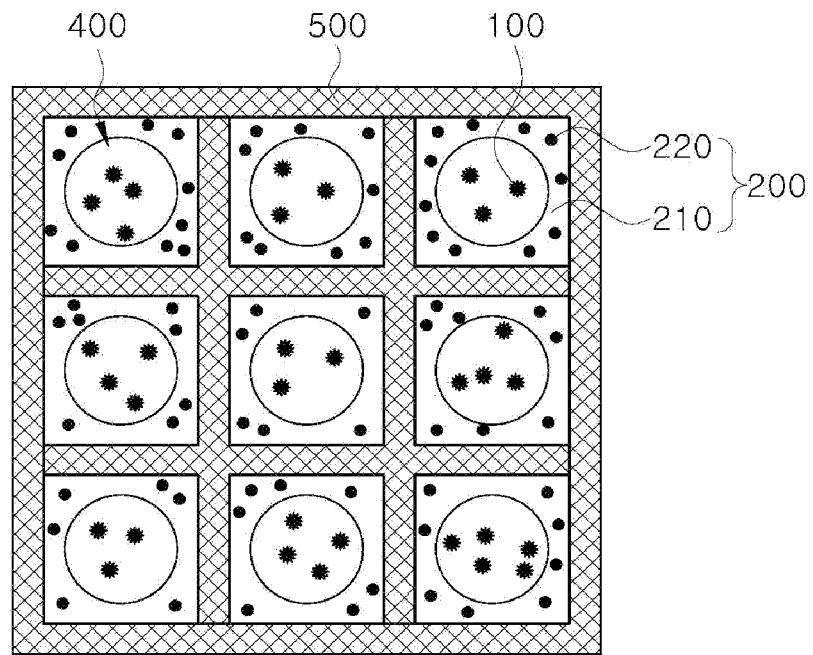
FIGS. 7 to 9 are plan views illustrating a partition of an absorption filter.
Figure 8:
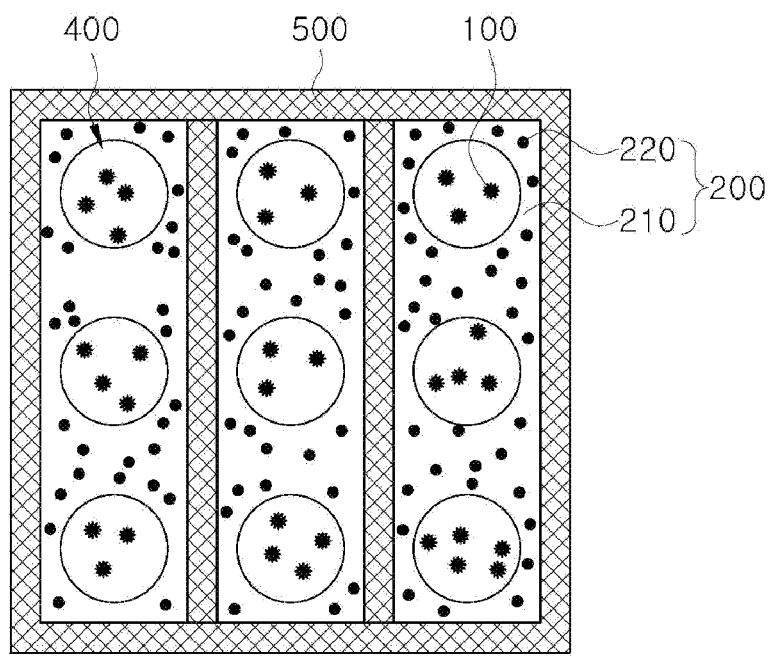
Figure 9:
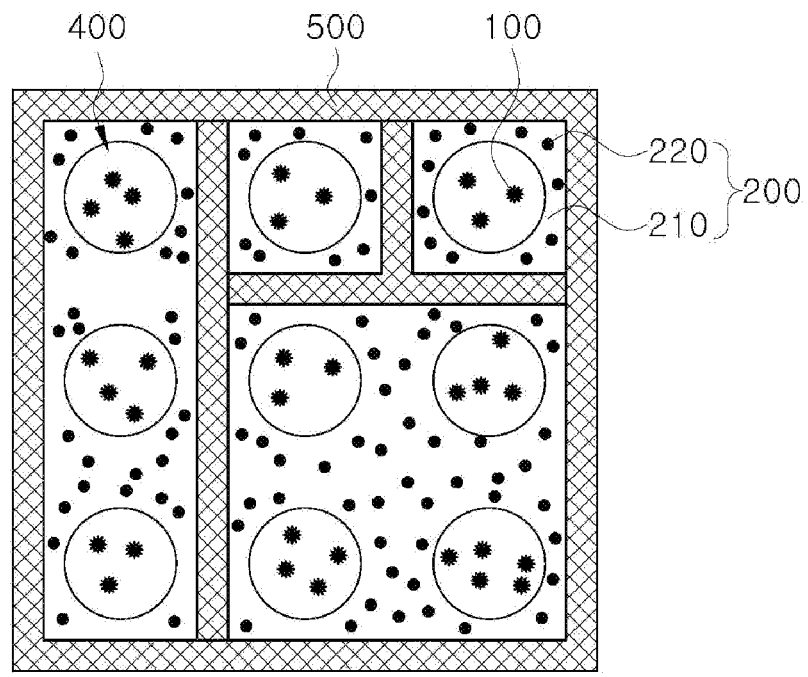
Figure 10:
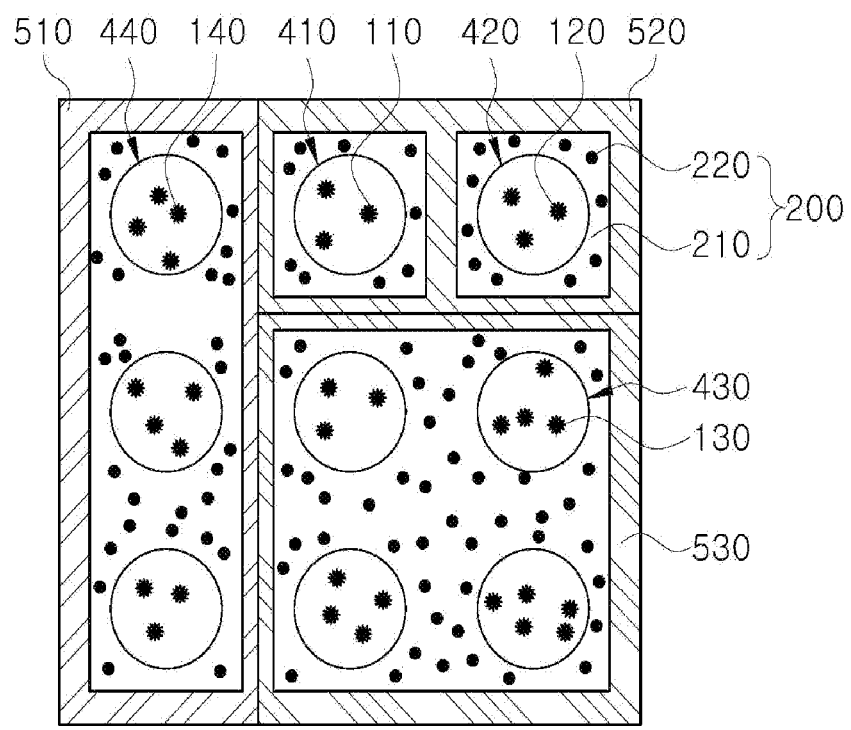
FIG. 10 is a plan view illustrating a multiple partition of the absorption filter.

FIGS. 7 to 9 are plan views illustrating a partition of an absorption filter. FIG. 10 is a plan view illustrating a multiple partition of the absorption filter.

As illustrated in FIGS. 7 to 10, the main partition 500 may be made of a material that blocks light within a specific wavelength band generated by the measurement object 100 accommodated within the well 400 from being transmitted in a direction of the adjacent wells 400. In the present disclosure, it is possible to prevent light noise from being provided in a direction of the adjacent wells 400 by the main partition 500 to obtain a clear optical signal without noise.

As illustrated in FIG. 7, the main partition 500 may be a well unit partition surrounding each well 400.

In certain cases, as illustrated in FIG. 8, the main partition 500 may be a group unit partition surrounding each well group when a well group in which a plurality of wells 400 form one group is formed.

In another case, the main partition 500 may be a mixed partition in which a well unit partition surrounding each well 400 and a group unit partition surrounding a well group in which a plurality of wells 400 form one group is mixed.

In the plurality of wells 400 forming a well group, the measurement object 100 generating light within a specific wavelength band that does not provide noise in a direction of adjacent wells 400 may be accommodated within the well group. In other words, a plurality of wells 400 that do not generate light noise may form one well group.

In addition, in the plurality of wells 400 forming the well group, partitions may not exist between adjacent wells 400 within the well group.

In addition, as illustrated in FIG. 10, the main partition 500 may include a single partition made of a material that blocks all of light within a first wavelength band generated by the first measurement object 110 accommodated in the first well 410 and a light in a second wavelength band generated by the second measurement object 120 accommodated in a second well 420 adjacent to the first well 410.

In addition, the main partition 500 may include a double partition including a first partition made of a material that blocks only light within a first wavelength band generated by the first measurement object 110 accommodated in the first well 410, and a third partition made of a material that blocks only light within a third wavelength band generated by the third measurement object 130 accommodated in the second well 430 adjacent to the first well 410.

The main partition 500 may be formed as a double partition when at least one of a first condition in which the first measurement object 110 and the third measurement object 130 are different from each other; a second condition in which the first measurement object 110 and the third measurement object 130 are identical to each other and a first fluorescent dye included in the first measurement object 110 and a third fluorescent dye included in the third measurement object 130 are different from each other; a third condition in which the first measurement object 110 and the third measurement object 130 are identical to each other and a first probe connector connecting the first measurement object 110 and the first fluorescent dye and a third probe connector connecting the third measurement object 130 and the third fluorescent dye are different from each other; and a fourth condition in which a first patient who provides the first measurement object and a second patient who provides the second measurement object are different from each other, is satisfied.

In addition, the main partition 500 may include a multiple partition including a first partition made of a material that blocks only light within a first wavelength band generated by the first measurement object 110 accommodated in the first well 410, a third partition made of a material that blocks only light within a third wavelength band generated by the third measurement object 130 accommodated in the third well 430 adjacent to the first well 410, and a fourth partition made of a material that blocks only light in a fourth wavelength band generated by the fourth measurement object 140 accommodated in the fourth well 440 adjacent to the first and third wells 410 and 430.

The main partition 500 may be formed as a multiple partition when at least one of a first condition in which first, third, and fourth measurement objects 110, 130, and 140 are different from one another; a second condition in which the first, third, and fourth measurement objects 110, 130, and 140 are identical to one another, and a first fluorescent dye included in the first measurement object 110, a third fluorescent dye included in the third measurement object 130, and a fourth fluorescent dye included in the fourth measurement object 140 are different from one another; a third condition in which the first, third, and forth measurement objects 110, 130, and 140 are identical to one another, and a first probe connector connecting the first measurement object and the first fluorescent dye, a third probe connector connecting the third measurement object and the third fluorescent dye, and a fourth probe connector connecting the fourth measurement object and the fourth fluorescent dye are different from one another; and a fourth condition in which a first patient who provides the first measurement object 110, a third patient who provides the third measurement object 130, and a fourth patient who provides the fourth measurement object 140 are different from one another, is satisfied.

Figure 11:
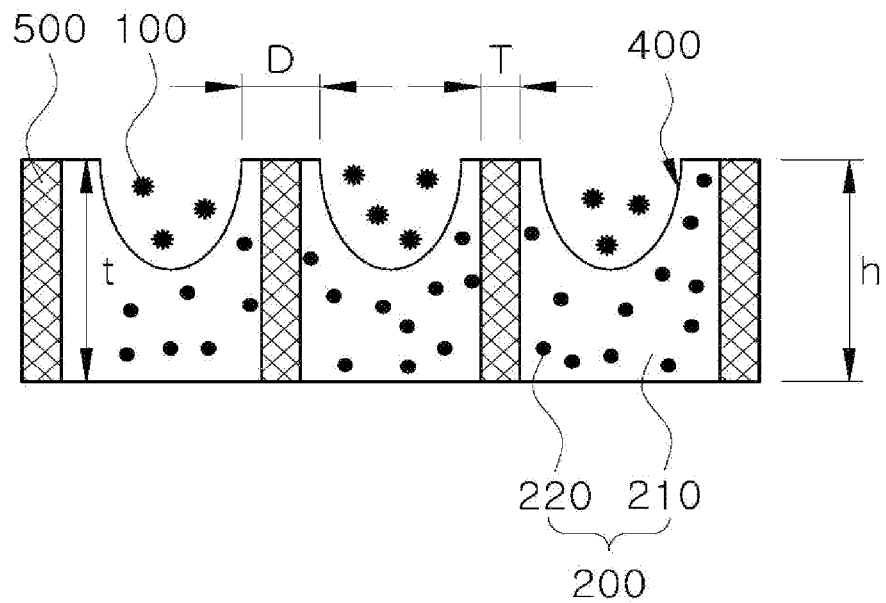
FIG. 11 is a structural cross-sectional view illustrating a partition arrangement of the absorption filter.

FIG. 11 is a structural cross-sectional view illustrating a partition arrangement of the absorption filter.

As illustrated in FIG. 11, in the absorption filter 200, the main partition 500 may be disposed between the wells 400 adjacent to each other.

The height h of the main partition 500 may be equal to the thickness t of the absorption filter 200.

In certain cases, the height h of the main partition 500 may have a greater value than the thickness t of the absorption filter 200.

Here, when blocking the light noise between the wells 400 adjacent to each other, the blocking efficiency may be further increased.

In addition, the thickness T of the main partition 500 may be equal to or thinner than the distance D between the wells 400 of the absorption filter 200.

Here, when the thickness T of the main partition 500 is thicker than the distance D between the wells 400 of the absorption filter 200, the light transmittance is lowered, so that a clear optical signal may not be obtained due to insufficient light quantity.

Figure 12:
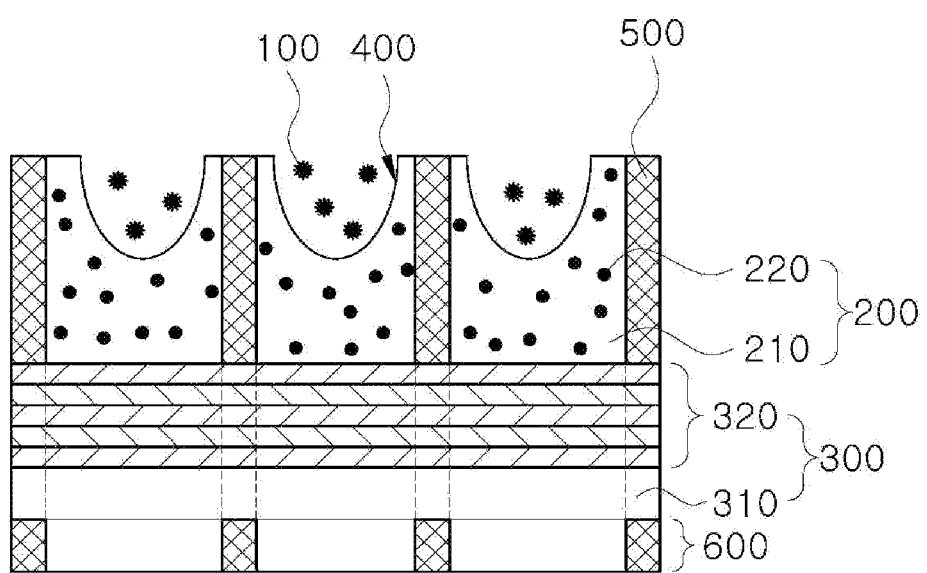
FIG. 12 is a structural cross-sectional view illustrating a position of a partition layer.

FIG. 12 is a structural cross-sectional view illustrating a position of a partition layer.

As illustrated in FIG. 12, the fluorescence filter of the present disclosure may further include a partition layer 600 disposed adjacent to the reflection filter 300.

The partition layer 600 may include a plurality of sub-partitions 610 disposed to correspond to the main partition 500 of the absorption filter 200.

As an example, the plurality of sub-partitions 610 may be disposed to be aligned with the main partition 500 of the absorption filter 200.

The reason is to allow light generated by the measurement object 100 accommodated in each well 400 to transmit the absorption filter 200 and the reflection filter 300 in a direction of an image sensor without noise.

In other words, when the main partition 500 of the absorption filter 200 is a well unit partition surrounding each well 400, the plurality of sub-partitions 610 may be formed to have the same shape to be aligned with the well unit partition.

In certain cases, when the main partition 500 of the absorption filter 200 is a group unit partition surrounding the well group, the plurality of sub-partitions 610 may be formed to have the same shape to be aligned with the group unit partition.

As another case, when the main partition 500 of the absorption filter 200 is a mixed partition mixed with a well unit partition surrounding each well 400 and a group unit partition surrounding the well group, the plurality of sub-partitions 610 may be formed to have the same shape to be aligned with the mixed partition.

FIGS. 13 to 16 are structural cross-sectional views illustrating a fluorescence filter according to another embodiment of the present disclosure.

As illustrated in FIGS. 13 to 16, the fluorescence filter of the present disclosure may include the absorption filter 200 and the reflection filter 300 disposed adjacent to the absorption filter 200.

Figure 13:
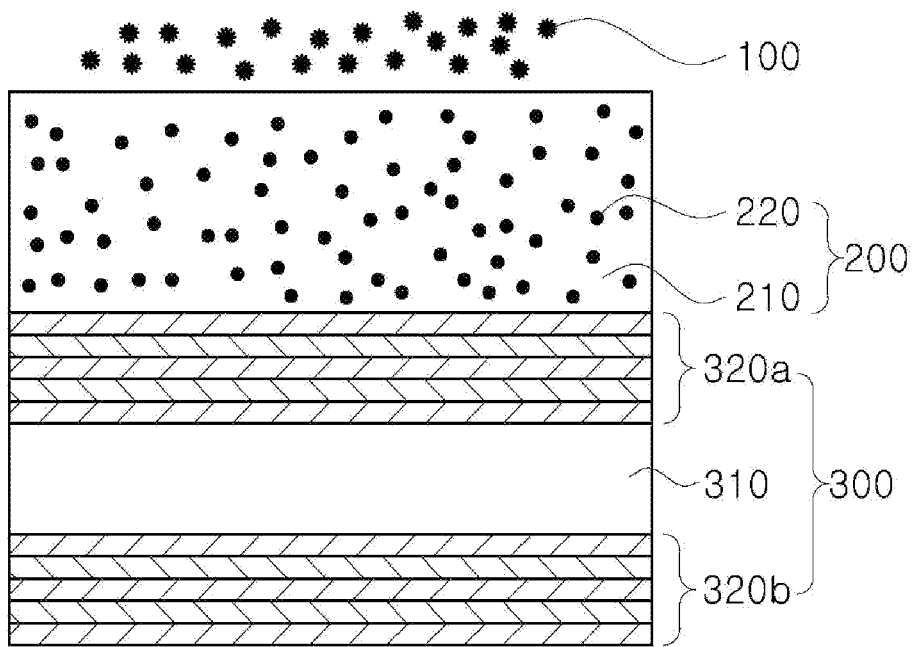
FIGS. 13 to 16 are structural cross-sectional views illustrating a fluorescence filter according to another embodiment of the present disclosure.

As illustrated in FIG. 13, the absorption filter 200 may be disposed in contact with an upper surface of the reflection filter 300 when external light is incident in a direction of the absorption filter 200.

In the absorption filter 200, the measurement object 100 may be disposed on an upper surface thereof without a well in which the measurement object is accommodated.

Figure 14:
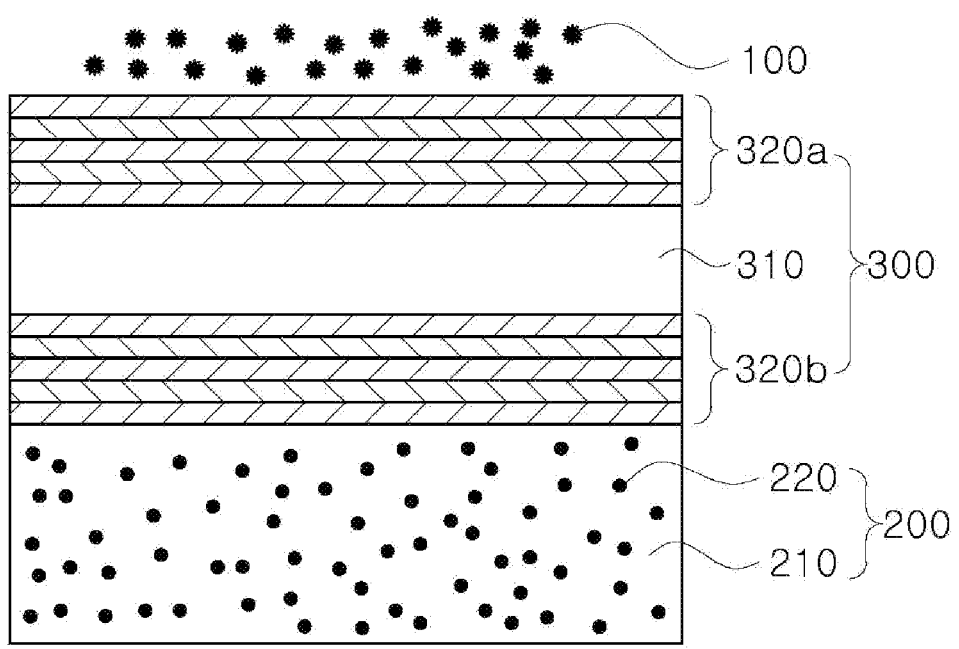

In certain cases, as illustrated in FIG. 14, the absorption filter 200 may be disposed in contact with a lower surface of the reflection filter 300 when external light is incident in a direction of the reflection filter 300.

In the absorption filter 200, the measurement object 100 may be disposed on an upper surface of the reflection filter 300 without a well in which the measurement object is accommodated.

Figure 15:
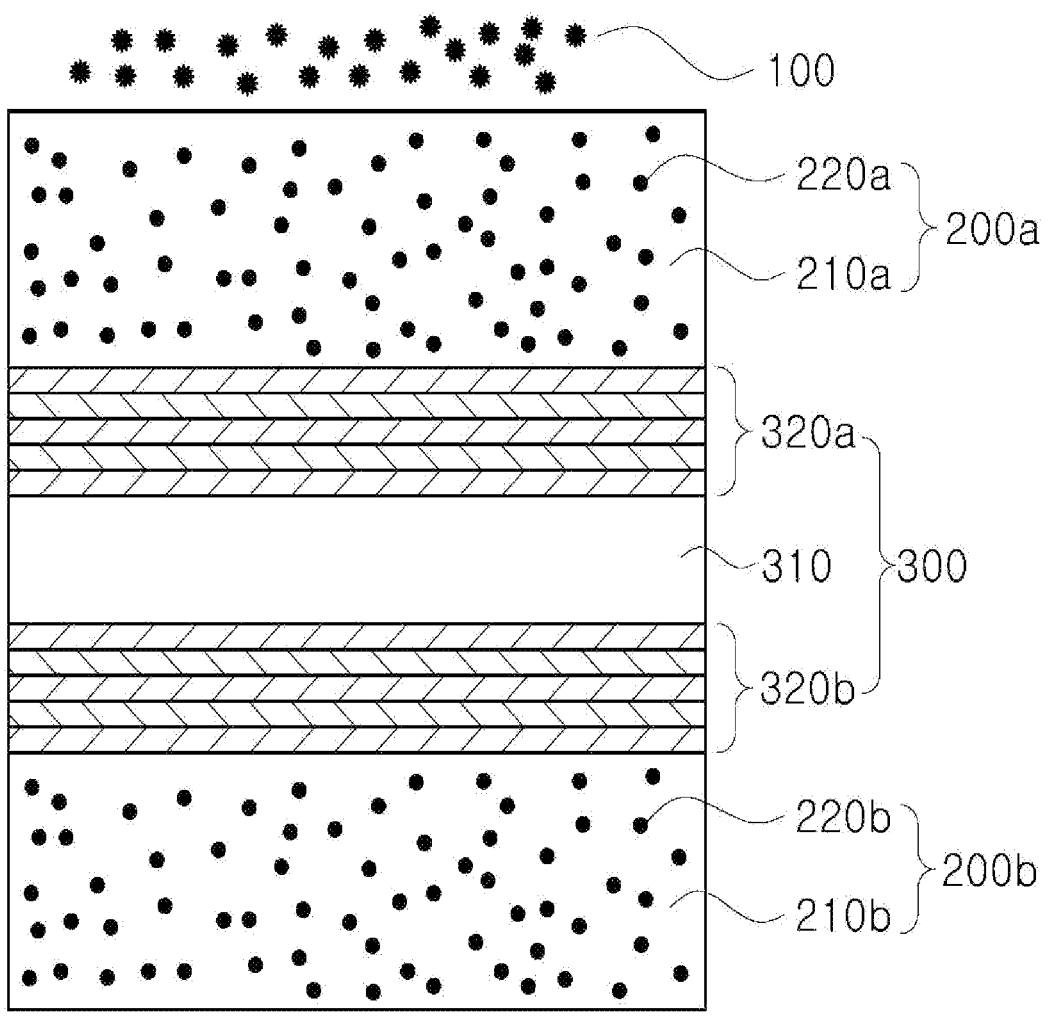

As another case, as illustrated in FIG. 15, the absorption filter 200 may include a first absorption filter 200a disposed in contact with an upper surface of the reflection filter 300, and a second absorption filter 200b disposed in contact with a lower surface of the reflection filter 300.

In the absorption filter 200, the measurement object 100 may be disposed on an upper surface of the absorption filter 200a without a well in which the measurement object is accommodated.

Figure 16:
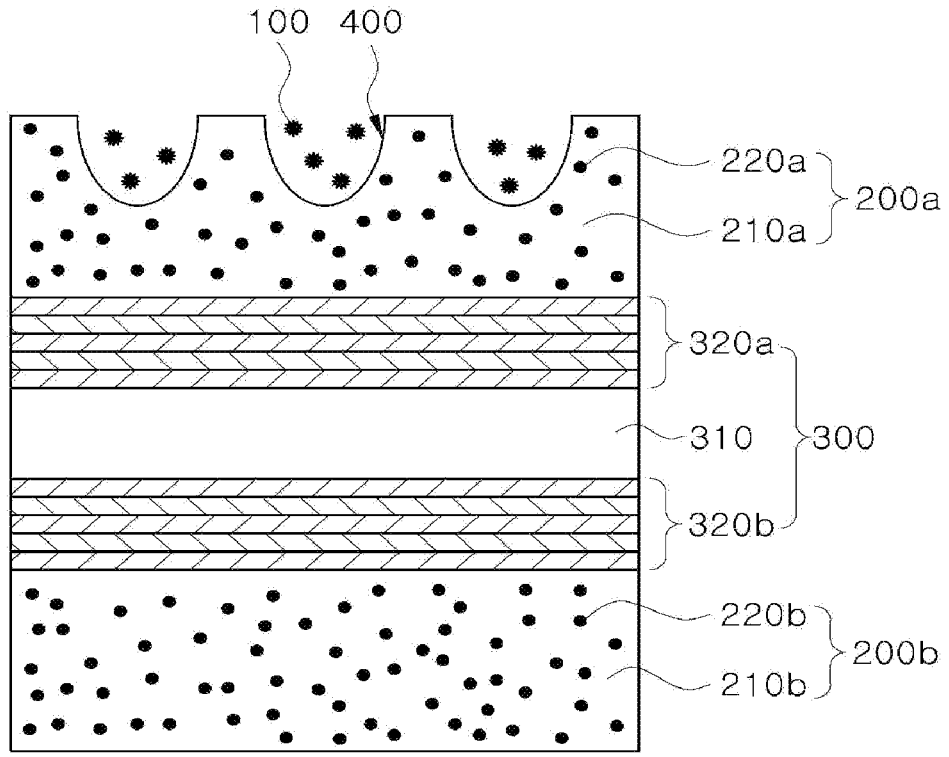

As another case, as illustrated in FIG. 16, in the absorption filter 200, the well 400 may be disposed in the first absorption filter 200a positioned in a direction in which external light is incident among the first and second absorption filters 200a and 200b.

In addition, the reflection filter 300 may include a glass substrate 310 and a multilayer film 320 in which a plurality of layers is formed on the glass substrate 310 to transmit light within a specific wavelength band generated by the measurement object 100 and reflect light in the remaining wavelength bands.

In an embodiment, the multilayer film 320 of the reflection filter 300 may be disposed in an upper portion of the glass substrate 310 and contact the absorption filter 200.

In another embodiment, the multilayer film 320 of the reflection filter 300 may be disposed in a lower portion of the glass substrate 310 to be spaced apart from the absorption filter 200.

As another embodiment, the multilayer film 320 of the reflection filter 300 may include an upper multilayer film 320a disposed in an upper portion of the glass substrate 310 and a lower multilayer film 320b disposed in a lower portion of the glass substrate 310.

Figure 17:
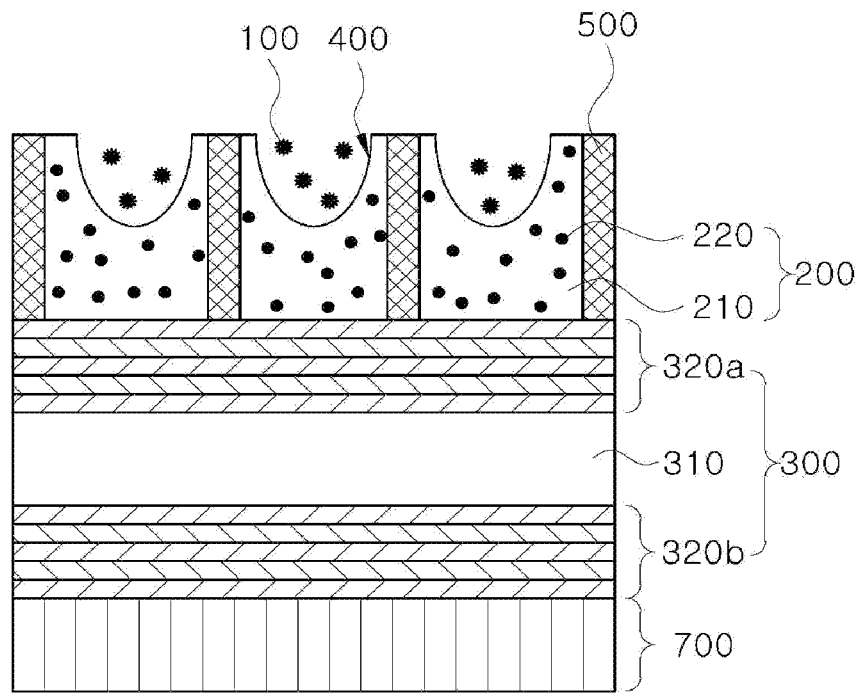
FIG. 17 is a structural cross-sectional view illustrating an image sensor module according to the present disclosure.
Figure 18:
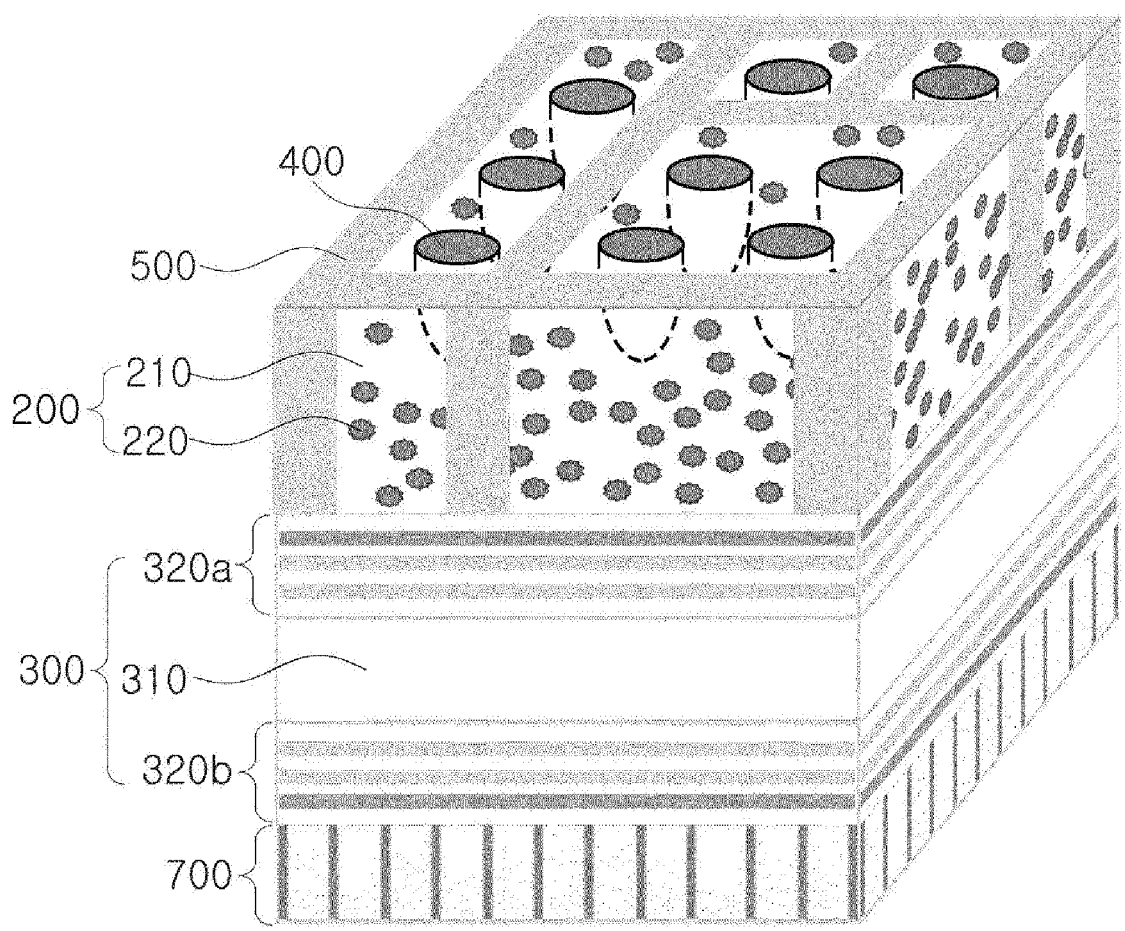
FIG. 18 is a perspective view illustrating an image sensor module according to the present disclosure.

FIG. 17 is a structural cross-sectional view illustrating an image sensor module according to the present disclosure. FIG. 18 is a perspective view illustrating an image sensor module according to the present disclosure.

As illustrated in FIGS. 17 and 18, an image sensor module of the present disclosure includes a fluorescence filter transmitting only light within a specific wavelength band generated by the measurement object 100, and an image sensor 700 that senses light within a specific wavelength band transmitting the fluorescence filter.

The image sensor 700 may be configured to convert incident light into an electrical signal and display or store the same on a display device.

In addition, the image sensor 700 includes a photodiode converting light energy into electrical energy, and the photodiode may be disposed on a side to which light is incident.

In addition, a fluorescence filter may include the absorption filter 200 transmitting light within a specific wavelength band generated by the measurement object 100 and absorbs light in the remaining wavelength bands, and the reflection filter 300 that is disposed adjacent to the absorption filter 200, transmits light within a specific wavelength band generated by the measurement object 100 and reflects light in the remaining wavelength bands.

The absorption filter 200 may have the well 400 having a predetermined depth in which the measurement object 100 is accommodated, and a plurality of wells 400 may be disposed at regular intervals on an incident surface of the absorption filter 200 to which external light is incident.

Figure 19:
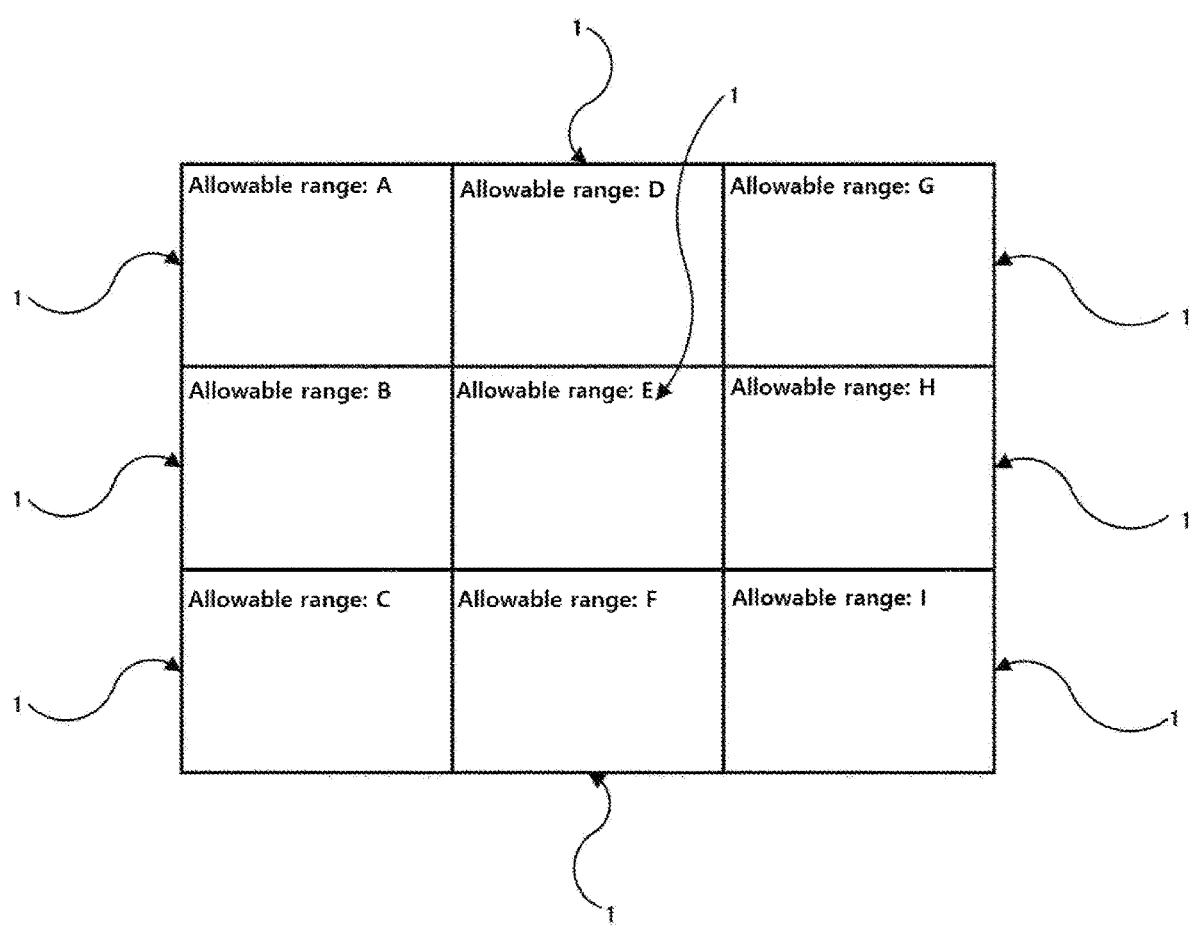
FIG. 19 is a schematic diagram illustrating an image sensor module array according to the present disclosure.

FIG. 19 is a schematic diagram illustrating an image sensor module array according to the present disclosure.

As illustrated in FIG. 19, an image sensor module array of the present disclosure includes a fluorescence filter transmitting only light within a specific wavelength band generated by a measurement object, and a plurality of image sensor modules 1 including an image sensor that senses light within a specific wavelength band transmitting the fluorescence filter.

The plurality of image sensor modules 1 are disposed in a matrix form to sense light within a specific wavelength band generated by different measurement objects to obtain a plurality of optical signals for the plurality of measurement objects.

In addition, the plurality of image sensor modules 1 may be disposed so as not to overlap each other in a direction in which light is incident.

In addition, the plurality of image sensor modules 1 may be disposed in a rectangular shape, but is not limited thereto.

In other words, the arrangement of the plurality of image sensor modules 1 may be changed according to design.

In addition, the plurality of image sensor modules 1 may have different passbands, but is not limited thereto, and a portion of the plurality of image sensor modules 1 may have the same passband.

For example, any one image sensor module 1 may be configured such that light having a wavelength within the A passband is incident, and the other image sensor module 1 may be configured such that light having a wavelength within the B passband is incident.

In addition, the plurality of image sensor modules 1 may be configured such that each passband does not overlap each other.

In addition, the plurality of image sensor modules 1 may be configured such that each passband partially overlaps each other.

In addition, the plurality of image sensor modules 1 may be formed and configured integrally with other adjacent image sensor modules 1.

As described above, the present disclosure is capable of clearly acquiring an optical signal of a measurement object by performing a precise filtering transmitting only light within a desired wavelength band by disposing an absorption filter transmitting light within a specific wavelength band generated by the measurement object and absorbs light in the remaining wavelength bands, and a reflection filter transmitting light within a specific wavelength band generated by the measurement object, and reflects light in the remaining wavelength band together, and an image sensor module including the same.

In addition, according to the present disclosure, it is possible to obtain a precise and clear optical signal by minimizing noise by disposing a partition in the absorption filter to block ambient light noise.

Hereinbefore, the present disclosure has been described with reference to the embodiments. It will be understood by those having ordinary skill in the technical field to which the present disclosure pertains that the present disclosure may be embodied in various other specific forms without departing from the technical ideas or essential characteristics thereof. Therefore, the disclosed embodiments should be considered in an illustrative rather than a restrictive perspective in all aspects.

The invention claimed is:

1. A fluorescence filter including:
an absorption filter configured to:
transmit light within a specific wavelength band generated by a measurement object, and
absorb light in the remaining wavelength bands, and
a reflection filter that is disposed adjacent to the absorption filter, and configured to:
transmit light within a specific wavelength band generated by the measurement object, and
reflect light in the remaining wavelength bands,
wherein the absorption filter has a plurality of wells having a predetermined depth in which the measurement object is accommodated, and
wherein the plurality of wells are disposed at regular intervals on an incident surface of the absorption filter to which external light is incident.

2. The fluorescence filter of claim 1, wherein the absorption filter is characterized in that a base medium and an absorption material absorbing light in a wavelength band other than a specific wavelength band generated by the measurement object are mixed.

3. The fluorescence filter of claim 2, wherein the absorption material is at least one of a pigment and a photoresist.

4. The fluorescence filter of claim 1, wherein the absorption filter further includes a main partition disposed between the wells adjacent to each other.

5. The fluorescence filter of claim 4, wherein the main partition is made of a material that blocks light within a specific wavelength band generated by the measurement object accommodated within the well from being transmitted in a direction of adjacent wells.

6. The fluorescence filter of claim 4, wherein the main partition is a single partition made of a material that blocks all of light within a first wavelength band generated by a first measurement object accommodated in a first well and a light in a second wavelength band generated by a second measurement object accommodated in a second well adjacent to the first well.

7. The fluorescence filter of claim 4, wherein the main partition is a double partition including a first partition made of a material that blocks only light within a first wavelength band generated by a first measurement object accommodated in a first well, and a second partition made of a material that blocks only light in a second wavelength band generated by a second measurement object accommodated in a second well adjacent to the first well.

8. The fluorescence filter of claim 7, wherein the main partition is formed as the double partition when at least one of a first condition in which the first measurement object and the second measurement object are different from each other; a second condition in which the first measurement object and the second measurement object are identical to each other and a first fluorescent dye included in the first measurement object and a second fluorescent dye included in the second measurement object are different from each other; a third condition in which the first measurement object and the second measurement object are identical to each other and a first probe connector connecting the first measurement object and the first fluorescent dye and a second probe connector connecting the second measurement object and the second fluorescent dye are different from each other; and a fourth condition in which a first patient who provides the first measurement object and a second patient who provides the second measurement object are different from each other, is satisfied.

9. The fluorescence filter of claim 4, wherein the main partition is a multiple partition including a first partition made of a material that blocks only light within a first wavelength band generated by a first measurement object accommodated in a first well, a second partition made of a material that blocks only light in a second wavelength band generated by a second measurement object accommodated in a second well adjacent to the first well, and a third partition made of a material that blocks only light within a third wavelength band generated by a third measurement object accommodated in a third well adjacent to the first and second wells.

10. The fluorescence filter of claim 9, wherein the main partition is formed as the multiple partition when at least one of a first condition in which the first, second, and third measurement objects are different from one another; a second condition in which the first, second, and third measurement objects are identical to one another, and a first fluorescent dye included in the first measurement object, a second fluorescent dye included in the second measurement object, and a third fluorescent dye included in the third measurement object are different from one another; a third condition in which the first, second, and third measurement objects are identical to one another, and a first probe connector connecting the first measurement object and the first fluorescent dye, a second probe connector connecting the second measurement object and the second fluorescent dye, and a third probe connector connecting the third measurement object and the third fluorescent dye are different from one another; and a fourth condition in which a first patient who provides the first measurement object, a second patient who provides the second measurement object, and a third patient who provides the third measurement object are different from one another, is satisfied.

11. The fluorescence filter of claim 4, further including a partition layer disposed adjacent to the reflection filter, wherein the partition layer includes a plurality of sub-partitions disposed to correspond to the main partition of the absorption filter.

12. The fluorescence filter of claim 11, wherein the plurality of sub-partitions is disposed to be aligned with the main partition of the absorption filter.

13. The fluorescence filter of claim 1, wherein the reflection filter includes a glass substrate and a multilayer film in which a plurality of layers is formed on the glass substrate to transmit light within a specific wavelength band generated by the measurement object, and reflect light in the remaining wavelength bands.

14. The fluorescence filter of claim 13, wherein the multilayer film is disposed in an upper portion of the glass substrate or a lower portion of the glass substrate.

15. The fluorescence filter of claim 14, wherein the multilayer film is a high pass filter transmitting light in a high wavelength band and blocks light in a low wavelength band or a low pass filter transmitting light in a low wavelength band and blocks light in a high wavelength band.

16. The fluorescence filter of claim 13, wherein the multilayer film includes an upper multilayer film disposed in an upper portion of the glass substrate and a lower multilayer film disposed in a lower portion of the glass substrate.

17. The fluorescence filter of claim 1, wherein the absorption filter includes a first absorption filter disposed in contact with an upper surface of the reflection filter, and a second absorption filter disposed in contact with a lower surface of the reflection filter.

18. The fluorescence filter of claim 17, wherein the plurality of wells are disposed in an absorption filter positioned in a direction in which the external light is incident among the first and second absorption filters.

19. An image sensor module including:
a fluorescence filter configured to transmit only light within a specific wavelength band generated by a measurement object; and
an image sensor configured to sense light within a specific wavelength band transmitting the fluorescence filter,
wherein the fluorescence filter includes:
an absorption filter configured to:
transmit light within a specific wavelength band generated by a measurement object, and
absorb light in the remaining wavelength bands, and
a reflection filter that is disposed adjacent to the absorption filter, and configured to:
transmit light within a specific wavelength band generated by the measurement object, and
reflect light in the remaining wavelength bands,
wherein the absorption filter has a plurality of wells having a predetermined depth in which the measurement object is accommodated, and
wherein the plurality of wells are disposed at regular intervals on an incident surface of the absorption filter to which external light is incident.

20. An image sensor module array including:
a plurality of image sensor modules including a fluorescence filter and an image sensor, the fluorescence filter transmits only light within a specific wavelength band generated by a measurement object, and the image sensor senses light within a specific wavelength band transmitting the fluorescence filter,
wherein the plurality of image sensor modules is disposed in a matrix form to sense light within a specific wavelength band generated by different measurement objects to obtain a plurality of optical signals for the plurality of measurement objects;
wherein the fluorescence filter includes an absorption filter transmitting light within a specific wavelength band generated by the measurement object and absorbs light in the remaining wavelength bands, and a reflection filter that is disposed adjacent to the absorption filter, transmits light within a specific wavelength band generated by the measurement object, and reflects light in the remaining wavelength bands,
wherein the absorption filter has a plurality of wells having a predetermined depth in which the measurement object is accommodated, and
wherein the plurality of wells are disposed at regular intervals on an incident surface of the absorption filter to which external light is incident.

* * * * *